United States Patent
Chung et al.

(10) Patent No.: US 7,385,753 B2
(45) Date of Patent: Jun. 10, 2008

(54) HYBRID OPTICAL AMPLIFIER USING GAIN-CLAMPED SEMICONDUCTOR OPTICAL AMPLIFIER ENABLING RAMAN AMPLIFICATION

(75) Inventors: Hee Sang Chung, Daejeon (KR); Sun Hyok Chang, Daejeon (KR); Kwangjoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 178 days.

(21) Appl. No.: 11/010,350

(22) Filed: Dec. 14, 2004

(65) Prior Publication Data

US 2006/0050368 A1    Mar. 9, 2006

(30) Foreign Application Priority Data

Sep. 7, 2004    (KR) ............... 10-2004-0071222

(51) Int. Cl.
*H01S 3/00* (2006.01)

(52) U.S. Cl. .................... 359/334; 359/341.3

(58) Field of Classification Search ........... 359/334, 359/341.3
See application file for complete search history.

(56) References Cited

U.S. PATENT DOCUMENTS

| 5,184,247 | A | 2/1993 | Schimpe |
| 5,436,759 | A | 7/1995 | Dijali et al. |
| 6,751,013 | B1 * | 6/2004 | Wu ............... 359/337 |
| 7,012,742 | B2 * | 3/2006 | Lee et al. ......... 359/334 |
| 7,079,718 | B2 * | 7/2006 | Welch et al. ........ 385/14 |
| 7,088,502 | B2 * | 8/2006 | Lee et al. ......... 359/344 |
| 7,126,747 | B2 * | 10/2006 | Lee ............... 359/334 |

FOREIGN PATENT DOCUMENTS

| KR | 1020020076422 | 10/2002 |
| KR | 1020020076728 | 10/2002 |
| KR | 1020030034856 | 5/2003 |
| KR | 1020040006375 | 1/2004 |

OTHER PUBLICATIONS

A.K. Srivastava, et al.; "A Polarization Multiplexing Technique to Mitigate WDM Crosstalk in SOAs"; IEEE Photonics Technology Letters, vol. 12, No. 10, Oct. 2000; pp. 1415-1416.

Hyang K. Kim, et al.; "Reduction of Cross-Gain Modulation in the Semiconductor Optical Amplifier by Using Wavelength Modulated Signal"; IEEE Photonics Technology Letters, vol. 12, No. 10, Oct. 2000; pp. 1412-1414.

(Continued)

*Primary Examiner*—Deandra M Hughes
(74) *Attorney, Agent, or Firm*—Lowe Hauptman Ham & Berner LLP

(57) ABSTRACT

Provided is a hybrid optical amplifier using a gain-clamped semiconductor optical amplifier enabling Raman amplification. The hybrid optical amplifier comprises a spool of optical fiber used as transmission line in the optical communication, a GCSOA amplifying optical signal input via the optical fiber and generating a self-oscillation laser beam for gain-clamping through the gain medium, and a backward pumping Raman optical amplifier inducing Raman amplification by emitting the self-oscillation laser beam generated by the GCSOA into the optical fiber. Therefore, the Raman amplification can be obtained with a relatively simple structure using the GCSOA.

8 Claims, 5 Drawing Sheets

OTHER PUBLICATIONS

Hoin Kim, et al.; "A Gain-Clamped SOA with Distributed Bragg Reflectors Fabricated Under Both Ends of Active Waveguide with Different Lengths"; IEEE Photonics Technology Letters, vol. 16, No. 4, Apr. 2004; pp. 999-1001.

Manabu Yoshino, et al.; "Improvement of Saturation Output Power in a Semiconductor laser Amplifier Through Pumping Light Injection"; IEEE Photonics Technology Letters, vol. 8, No. 1, Jan. 1996; pp. 58-59.

Martin T. Hill, et al.; "Carrier Recovery Time in Semiconductor Optical Amplifiers that Employ Holding Beams"; Optics Letters; vol. 27, No. 18; Sep. 15, 2002; pp. 1625-1627.

G. Talli, et al.; "Gain Recovery Analysis in Semiconductor Optical Amplifiers with Holding Beam"; Department of Electronics Systems Engineering; University of Essex.

Yi Dong, et al.; "8×10 709Gb/s WDM Transmission Over 1050km SMF Suing Cascaded In-Line Semiconductor Optical Amplifier and DPSK Modulation Format"; Institute for Infocom Research.

Jianjun Yu, et al.; "Bi-Directional WDM Transmission by Use of SOAs as Inline Amplifiers Without Isolators"; Research Center COM; Technical University of Denmark.

* cited by examiner

HYBRID OPTICAL AMPLIFIER USING GAIN-CLAMPED SEMICONDUCTOR OPTICAL AMPLIFIER ENABLING RAMAN AMPLIFICATION

BACKGROUND OF THE INVENTION

This application claims the priority of Korean Patent Application No. 2004-71222, filed on Sep. 7, 2004, in the Korean Intellectual Property Office, the disclosure of which is incorporated herein in its entirety by reference.

1. Field of the Invention

The present invention relates to an optical amplifier, and more particularly, to a hybrid optical amplifier, a structure of which is more simplified, production of which is easy, and which is cost-effective, using a gain-clamped semiconductor optical amplifier enabling Raman amplification.

2. Description of the Related Art

The semiconductor optical amplifiers (SOAs) are optical amplifiers whose gain media are semiconductor. Even though the SOAs have various advantages such as compact size, easy wavelength-band selection, and wide wavelength bandwidth, fiber optical amplifiers are mainly used in the high-speed optical communication systems requiring the transmission rates of 2.5 Gbit/s or beyond since the signal crosstalk in the SOAs degrades transmission performance.

The signal crosstalk is understood in terms of gain-recovery time (GRT). For example, since the erbium-doped fiber amplifiers (EDFAs) have very slow gain dynamics compared with one-bit time slot (400 ps in 2.5 Gbit/s), the gain characteristics of the EDFAs are not changed during the fast signal modulation. The GRT of a typical EDFA is of the order of 10 ms. On the other hand, the SOAs have fast gain dynamics comparable to one-bit time slot. Since a typical SOA has the GRT of hundreds of ps (1 ps= $10^{-12}$ s), it responds to the fast signal modulation and its gain characteristic is changed according to the modulated signal patterns. In other words the gain characteristic of the SOA is changed according to the intensity of current and/or previous signal, which is called time-division multiplexed (TDM) crosstalk. Additionally the changes in the neighboring channels' intensity cause the change of the gain characteristic when the wavelength-division multiplexed (WDM) signals are input to the SOA, which is called WDM crosstalk.

To use SOAs for the high-speed optical communication, the crosstalk described above must be suppressed. There are several methods that have been reported to suppress the crosstalk, and a few of them are introduced below.

First, there is a holding-light injection method where an extra injection laser is injected to an SOA. The use of the injection light makes the SOA respond quicker so that the resultant GRT can become a tenth of the usual GRT. Due to this fast gain-recovery compared with one-bit time slot the WDM/TDM crosstalk are effectively suppressed. However, this method requires a separate external laser, which raises cost and increases total size.

Second, there is a method of modifying the transmitters and receivers instead of improving the SOAs. For example, in a reference paper (IEEE Photonics Technology Letters Vol. 12, No. 10, A. K. Srivastava, et al., "A polarization multiplexing technique to mitigate WDM crosstalk in SOAs"), two channels of different wavelengths were split with 1:1 ratio, each branch was intensity modulated out of phase (180°), and finally they were multiplexed using polarization-beam combiners. Since the signal modulated using this method had constant signal intensity, negligible crosstalk due to the intensity variation occurred after being transmitted through the usual SOAs. Before the signals arrived at the receivers, they were demultiplexed by polarization-beam demultiplexer. A similar method was introduced in another reference paper (IEEE Photonics Technology Letters Vol. 12, No. 10, Hyang K. Kim, et al., "Reduction of cross-gain modulation in the semiconductor optical amplifier by using wavelength modulated signal"). In this method, the crosstalk was suppressed by keeping the intensity of the input signals constant by using the auxiliary signals modulated out of phase whose wavelengths were 0.3 nm apart from the main signals. However, in these methods the widely used conventional transceivers should be changed, which requires higher system cost.

Third, there is a method of inducing laser oscillation so that it is possible to perform gain clamping in an SOA itself. According to U.S. Pat. No. 5,184,247 titled "Optically Stabilized Feedback Amplifier," a method of inducing laser oscillation using gratings for wavelength selection inside an SOA is disclosed. Also, according to U.S. Pat. No. 5,463,759 titled "Crosstalk Free, Low-noise Optical Amplifier," a method of stabilizing amplified signal by inducing laser oscillation in a direction perpendicular to signal propagation in an SOA is disclosed. These optical amplifiers are called gain-clamped semiconductor optical amplifiers (GCSOAs). The GCSOAs have advantages of simple structure and low cost since the external lasers of the first method are unnecessary, and the transceivers do not need to be modified.

Two main features of the present invention are gain-clamping introduced above and Raman amplification. The Raman amplification is based on the process of stimulated Raman scattering (SRS) that transfers part of pump energy to signal energy. The SRS in a spool of optical fiber is generated by the interaction of light with the molecular vibration of doped material. In the process, the frequency shift from the pump of short wavelength to the signal of long wavelength can be as large as 40 THz (300 nm). In particular, when the frequency shift is 13.2 THz (105 nm at ~1.55 µm, 73 nm at ~1.3 µm), the Raman amplification has gain peak. This plays an important role in the Raman amplification. In other words, the optical amplification is possible in any wavelength band by selecting appropriate pumping wavelength. However, since the SRS effect is rather weak in the usual optical fiber, long length of the optical fiber and high pump power are necessary to get a Raman optical amplifier (ROA) with reasonably high gain.

The ROAs and GCSOAs described above may be complementary in terms of the gain and noise characteristics. It is known that the GCSOAs have lower optical power compared with the EDFAs. In the optical transmission systems using such low power GCSOAs, an allowable WDM channel count is few and a span between the GCSOAs is short. To overcome these limitations, the combined amplifiers of the ROAs and GCSOAs may replace the pure GCSOAs. For example, to get 20-dB gain per span, a 10-dB GCSOA is enough if a 10-dB ROA is used simultaneously. Moreover, if the 10-dB ROA is inserted before the 10-dB GCSOA, the effective noise figure is better than that of a single 20-dB SOA FIG. 1 shows a schematic diagram of a conventional hybrid optical amplifier (HOA) where an ROA and an SOA are combined.

FIG. 1 refers to Korea Patent No. 0395430 entitled "Apparatus for coupling between raman optical fiber amplifier and semiconductor optical amplifier" wherein an HOA obtained by assembling a pump laser chip, an SOA chip, and a wavelength-selective coupler (WSC) into a package to effectively combine the ROA and the SOA is disclosed.

Referring to FIG. 1, the HOA 120 includes the optical fibers for transmission line 100 and 110, a laser diode chip 121, a dichroic mirror 124 passing incident signal beam passed through a first lens 122 and reflecting a laser beam input from the ROA laser diode chip 121 in the opposite direction to the incident signal beam, an isolator 125 isolating a Raman optical amplification part from a semiconductor amplification part, an SOA chip 127 amplifying the optical signal passed through the isolator 125, a second lens 123 emitting the laser beam generated by the ROA laser diode chip 121 to the dichroic mirror 124, a third lens 126 condensing the optical signal transmitted from the isolator 125 and emitting the condensed optical signal to the SOA chip 127, and a fourth lens 128 condensing the signal beam output from the SOA chip 127 to input to the optical fiber 110 in one package. Here, the Raman optical amplification laser provided to the dichroic mirror 124 can be provided by the ROA laser diode chip 121 included in the HOA 120 or provided outside.

The HOA described above includes the pump laser chip for Raman pumping, the WSC and the GCSOA chip. If all the components are to be packaged into one, manufacturing becomes difficult and the corresponding cost may rise. On the contrary, the present invention does not need a pump laser chip and a WSC for an HOA.

SUMMARY OF THE INVENTION

The present invention provides an HOA using a GCSOA enabling Raman amplification. It has a simpler structure than the previously invented HOA, which makes manufacturing easier and cost down. Moreover, the present invention provides the HOA that has an enhanced gain-control function to control the Raman gain. The present invention also provides the HOA using a GCSOA enabling Raman amplification without a separate pump laser for the ROA.

According to an aspect of the present invention, there is provided an HOA comprising a spool of optical fiber used as transmission line in the optical communication, a GCSOA amplifying optical signal input via the optical fiber and generating gain-control laser, and a backward pumping ROA inducing Raman amplification by emitting the gain-control laser into the optical fiber.

According to another aspect of the present invention, there is provided an HOA comprising a GCSOA amplifying input optical signal and generating gain-control laser, a spool of optical fiber which transmits the optical signal from the GCSOA, and a forward pumping ROA inducing Raman amplification by emitting the gain-control laser into the optical fiber.

According to another aspect of the present invention, there is provided an HOA comprising the first spool of optical fiber used as transmission line, the first GCSOA amplifying optical signal input via the first optical fiber and generating gain-control laser, a backward pumping ROA inducing Raman amplification by emitting the first gain-control laser into the first optical fiber, the second spool of optical fiber for dispersion compensation inputting the optical signal output from the first GCSOA, and the second GCSOA amplifying the optical signal input via the second optical fiber and generating gain-control laser.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will now be described more fully with reference to the accompanying drawing, in which an embodiment of the invention is shown.

A GCSOA is an optical amplifier of small size amplifying the high bit-rate signals of 2.5 Gbit/s or beyond without severe crosstalk penalty that is found in most of conventional SOAs. When an HOA is made by adding an ROA to the GCSOA, a disadvantage of the GCSOA, i.e., relatively lower output power, can be compensated, and the effective noise figure of the HOA can become lower than that of a single GCSOA.

The GCSOA will now be described with reference to FIGS. 2 through 5.

Figure 1:
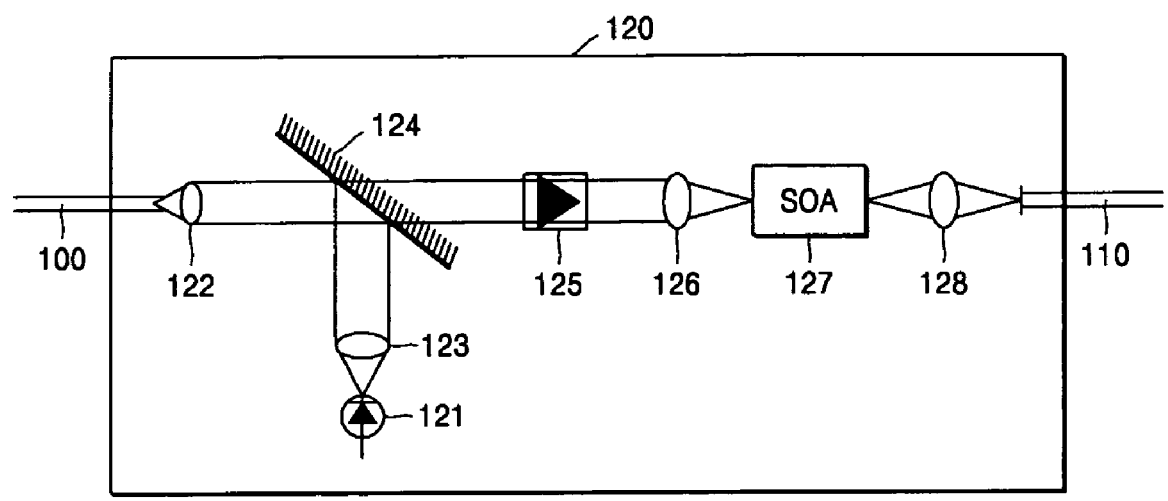
FIG. 1 is a schematic diagram of a conventional HOA in which an ROA and an SOA are combined.
Figure 2A:
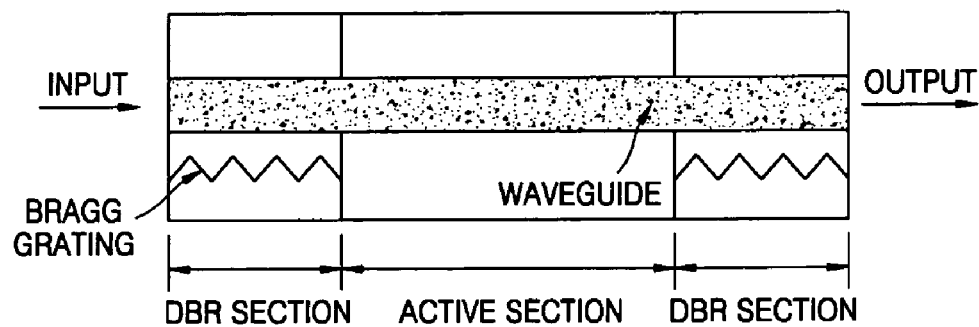
FIGS. 2A and 2B show structures of GCSOAs using Bragg gratings.
Figure 2B:
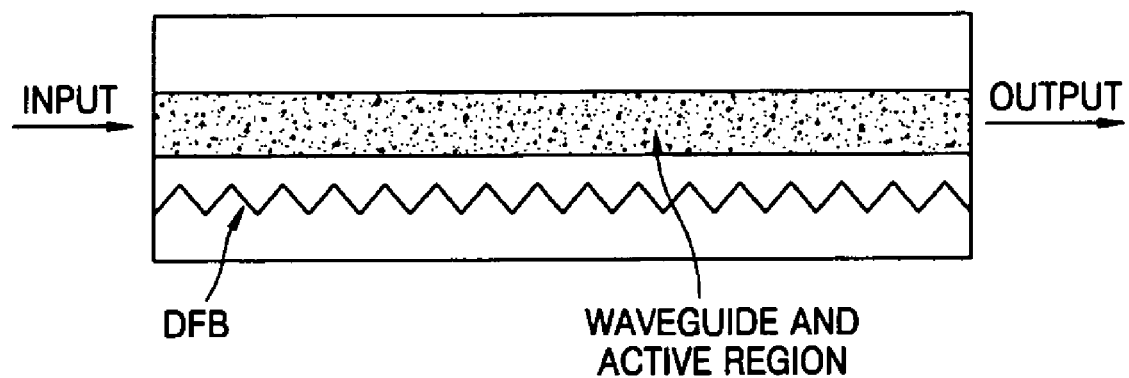

FIGS. 2A and 2B are examples of a GCSOA, and show structures of GCSOAs.

FIGS. 2A and 2B show structures of GCSOAs using Bragg gratings. FIG. 2A illustrates a method of forming Bragg gratings in both ends of a semiconductor chip. This method is called a distributed Bragg reflector method. FIG. 2B shows a distributed feedback (DFB) method.

In detail, an SOA forms a structure of a laser resonator inside by forming Bragg gratings that reflect narrow-band components of amplified spontaneous emission (ASE) from the SOA. The laser formed by the resonator is used for gain clamping of the SOA. Following the principle of laser, the gain clamping is a phenomenon accompanying to laser action. In addition, when a traveling-wave amplifier and a laser share a homogeneously broadened gain medium, the homogeneity makes the traveling waves have constant gain. When the optical power of a signal input to the SOA becomes low, the gain is clamped by self-increasing of optical power of the laser, and vice versa.

Figure 3:
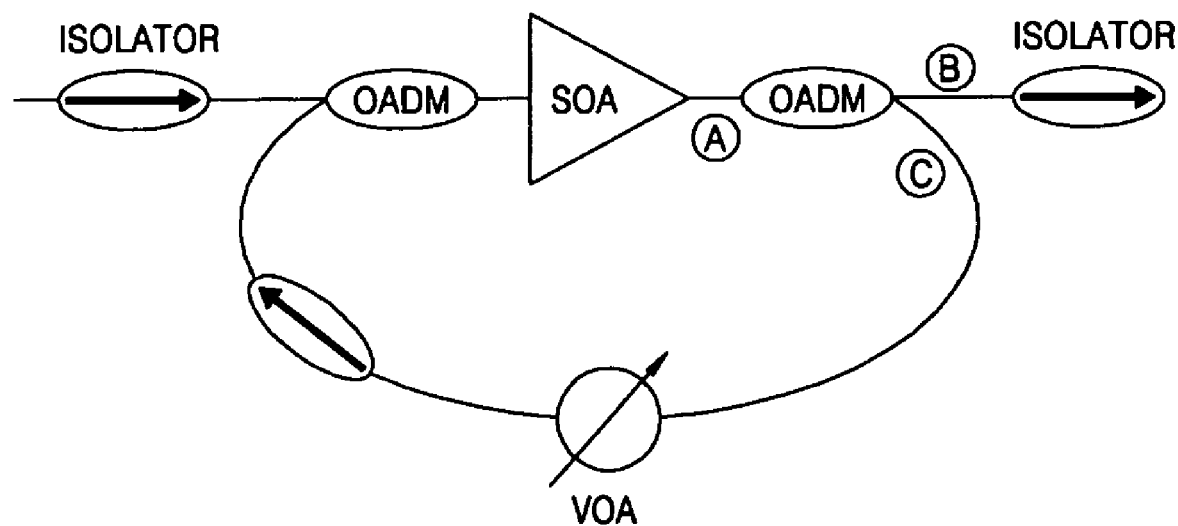
FIG. 3 is a schematic diagram of a gain-clamped SOA using an external laser cavity.

FIG. 3 is a schematic diagram of a gain-clamped SOA using an external cavity.

Referring to FIG. 3, an optical add drop multiplexer (OADM) has three ports. Light corresponding to a specific wavelength among light input via a port 'A' is output via a port 'C'. Intensity of the light output via the port 'C' is adjusted by a variable optical attenuator (VOA), and the adjusted light is input to the SOA via another OADM again.

Therefore, the light passing through the port 'C' resonates by repeating the process of being amplified by the SOA and input to the port 'A' of the OADM. A laser resonator having this structure is called a ring type laser resonator.

Figure 4:
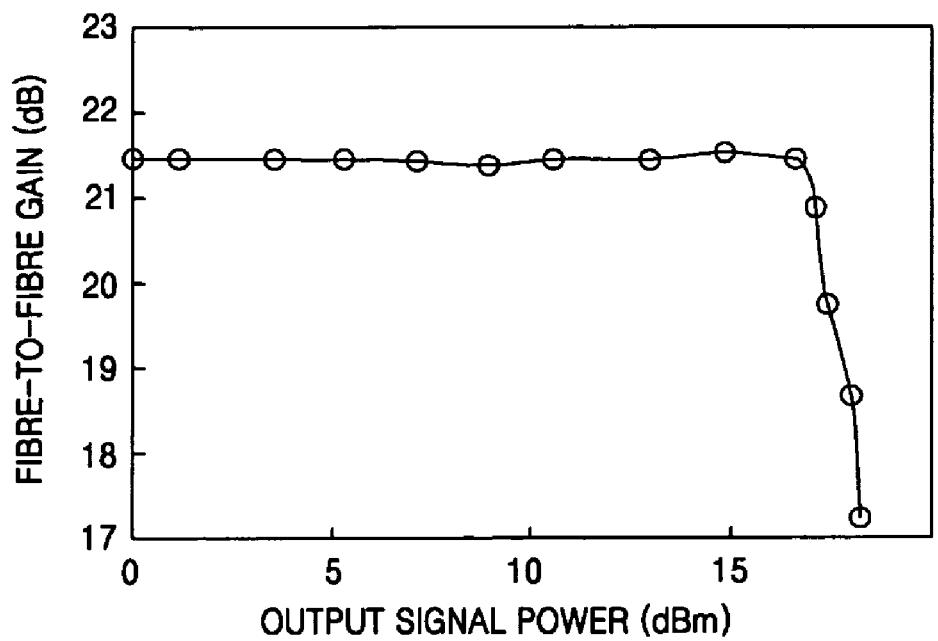
FIG. 4 is a diagram for showing gain characteristic of a GCSOA.

FIG. 4 is a diagram for showing gain characteristic of a GCSOA.

Referring to FIG. 4, FIG. 4 shows constant gain characteristic up to certain signal power, which is the typical behavior of the GCSOA.

In the Korea Patent No. 0395430 entitled "Apparatus for coupling between raman optical fiber amplifier and semiconductor optical amplifier," an HOA obtained by assembling a pump laser chip, a GCSOA chip, and a WSC into a package to effectively combine the ROA and the SOA is suggested. The ROA and SOA can be complementary in terms of gain and noise figure, which is explained in the reference.

In the embodiment of the present invention, unlike the suggested patent, an HOA using a GCSOA enabling Raman amplification without combining a separate ROA chip and a separate SOA chip as a package is suggested. The GCSOA includes a self-oscillating laser, and Raman gain is obtained by emitting properly adjusted wavelength of this laser into a spool of optical fiber connected to the GCSOA.

The specifications of FIGS. 2A, 2B, 3, and 4 are disclosed in Korea Patent Application No. 10-2004-0039985 entitled "Optical Time-Domain Reflectometer System with Gain-Clamped Optical Amplifiers" applied to the Korean Intellectual Property Office by the same applicant of the present invention.

Figure 5:
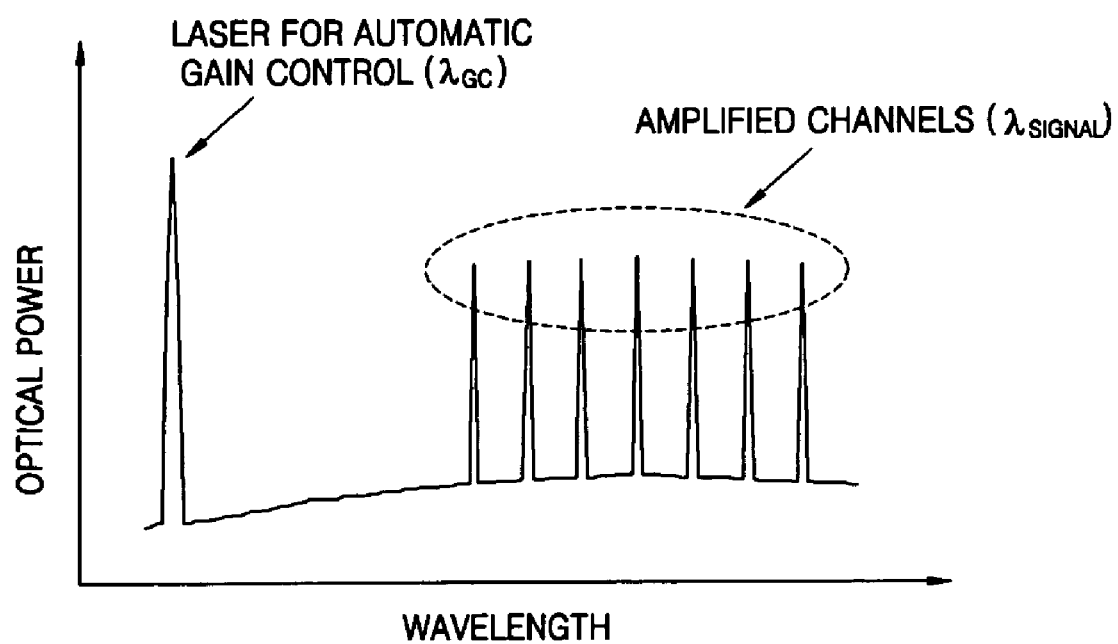
FIG. 5 is a diagram of a spectrum showing signal channels and a gain-clamped laser channel after a GCSOA.

FIG. 5 is a diagram of a spectrum showing signal channels and a gain-clamped laser channel after a GCSOA.

Referring to FIG. 5, when the laser wavelength ($\lambda_{GC}$) of the GCSOA amplifying $\lambda_{SIGNAL}$ in the C-band (1530-1560 nm) is ~1445 nm, the Raman gain peak is obtained at 1550 nm in Germanium co-doped silica optical fiber. That is, the GCSOA including a laser at ~1445 nm additionally provides the Raman gain in the C-band.

As another embodiment of the GCSOA, when $\lambda_{GC}$ is ~1475 nm, since the Raman gain is induced in the L-band (1570-1600 nm), the overall gain of the HOA occurs in the C-band plus the L-band.

Figure 6:
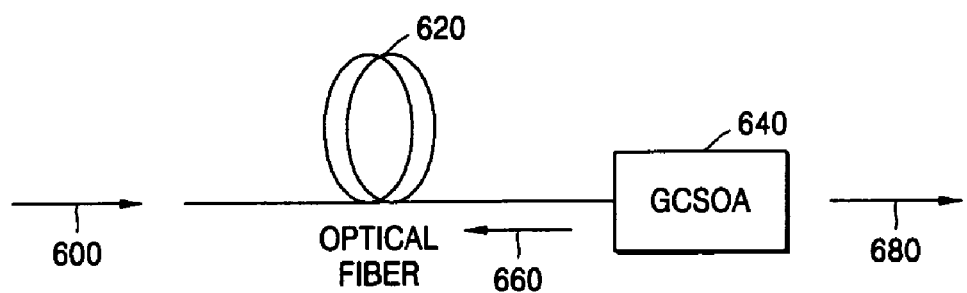
FIG. 6 is a block diagram of an HOA using a GCSOA enabling backward Raman amplification according to an embodiment of the present invention.

FIG. 6 is a block diagram of an HOA using a GCSOA 640 enabling backward Raman amplification according to an embodiment of the present invention.

Referring to FIG. 6, input optical signal 600 that is to be amplified is input to a spool of optical fiber 620 used as transmission line. The GCSOA 640 connected to the optical fiber 620 amplifies the input optical signal via the optical fiber 620. A laser signal 660 for gain clamping from the GCSOA 640 is output in the opposite direction to the input optical signal. Since the laser signal 660 is input backwardly to the optical fiber 620, the ROA comprising the fiber 620 and gain-clamping laser is the backward pumped ROA. Therefore, the overall output signal 680 output from the GCSOA 640 is amplified first by the Raman effect in the optical fiber 620, and then by the GCSOA 640. If there is no Raman pumping, i.e., the laser signal 660 for gain clamping is not input to the optical fiber 620, the optical fiber 620 acts only as a loss element. The widely used single-mode optical fiber has loss of 0.2 dB/km at 1550-nm transmission window. In this embodiment, the laser gain control method is used to control gain of the SOA. Additionally, the GCSOA is used to provide the Raman gain by outputting the laser signal into the transmission line.

As a reference, in the U.S. Pat. No. 5,184,247 entitled "Optically Stabilized Feedback Amplifier," a method of using an erbium doped fiber (EDF) instead of the optical fiber 620 is disclosed. In the reference, optical pumping is performed by a gain clamping laser output of 1480 nm from the GCSOA considering 1480-nm absorption band of the EDF, and an HOA is composed by combining the GCSOA and the EDFA. While the conventional EDFA induces population inversion of erbium ions in a gain medium through optical pumping and amplifies input optical signal based on the stimulated emission, the ROA part of the embodiment of the present invention provide amplification based on the SRS process. Also, while an EDFA uses EDF (a length of less than 100 m is enough for the most part) as a gain medium, an ROA uses transmission line itself that is used as optical path to transmit information from one region to another. In addition to the difference in the operation principles described above, the ROA has a merit of lower effective noise figure than that of the EDFA.

As disclosed in the U.S. Pat. No. 5,184,247 entitled "Optically Stabilized Feedback Amplifier" introduced as a conventional technology related to the GCSOA 640, a method of forming gratings in an SOA is known. As another method, there is also a method of using distributed Bragg reflectors (DBRs) to select a wavelength of a gain clamping laser as introduced in a reference paper (IEEE Photonics Technology Letters Vol. 16, No. 4, Hoin Kim, et al., "A Gain-Clamped SOA with Distributed Bragg Reflectors Fabricated under Both Ends of Active Waveguide with Different Lengths").

Figure 7:
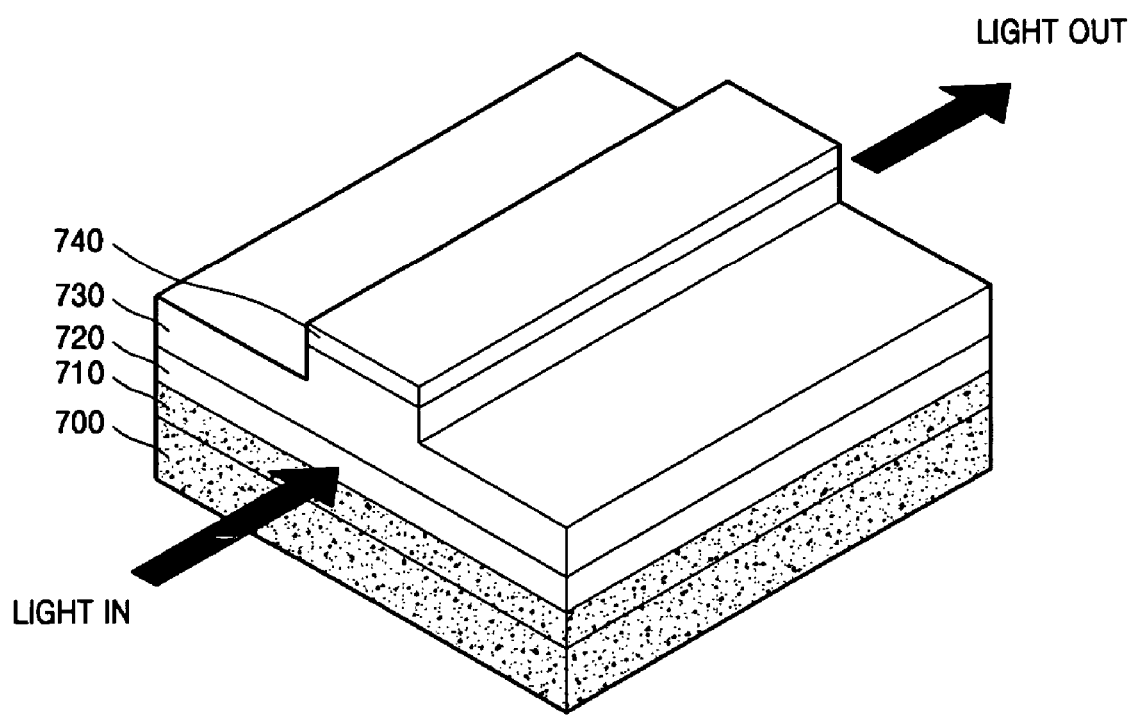
FIG. 7 is a perspective view of the GCSOA of FIG. 6.

FIG. 7 is a perspective view of the GCSOA 640 of FIG. 6.

Referring to FIG. 7, a perspective view for showing the GCSOA 640 in three dimensions is shown. The bottom layer is a substrate layer 700, and an InP substrate is used for 1550-nm wavelength band. A lower cladding layer 710 is formed on the substrate layer 700. In the lower cladding layer 710, gratings for selecting a laser wavelength may be engraved, or DBRs may be formed. An active layer 720 through which light is guided and amplified is formed on the lower cladding layer 710, and the active layer 720 acts as the core in the waveguide. An upper cladding layer 730 is formed on the active layer 720. The lower and upper cladding layers 710 and 730 have a lower effective refractive index rather than the active layer 720 and makes light passing through the GCSOA 640. A metal layer 740 for forming electrodes for supplying driving current to the GCSOA 640 is formed on the upper cladding layer 730.

Figure 8:
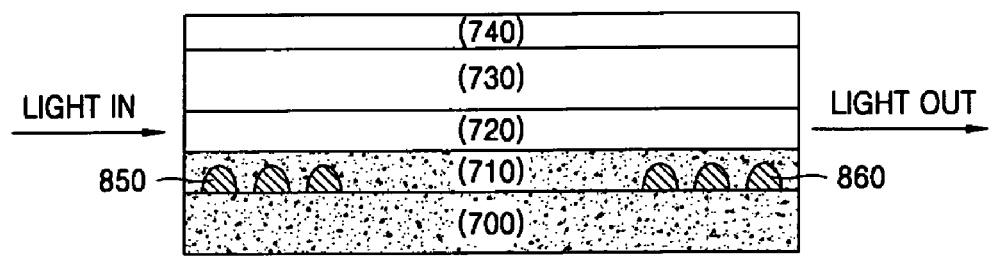
FIG. 8 is a cross-sectional view of the GCSOA of FIG. 6.

FIG. 8 is a cross-sectional view of the GCSOA 640 of FIG. 6.

Referring to FIG. 8, a cross-sectional view on the direction perpendicular to the signal propagation direction in the GCSOA 640 of FIG. 6 is shown. Reference numbers 700 through 740 correspond to the same numbered elements in FIG. 7. Reference numbers 850 and 860 are used for DBRs formed in the lower cladding layer 710 for wavelength selection. The reference number 850 indicates DBRs of the input end, and the reference number 860 indicates DBRs of the output end. The lengths of the input-end DBRs 850 and the output-end DBRs 860 may be symmetrically or asymmetrically formed. The reflection factors of the input end and the output end can be controlled by forming the lengths asymmetrically. When the reflection factors are controlled, the ratio of intensity of the gain-clamping laser output to the input end to intensity of the gain-clamping laser output to the output end is different. According to a reference document (IEEE Photonics Technology Letters, Vol. 16, No. 4, pp. 999-1001, 2004), when the DBR lengths of both ends are different, directivity appears on a GCSOA, and gain, noise, and saturation power in the case of inputting the signal in the direction of a longer DBR length are better than those in the case of inputting the signal in the direction of a shorter DBR length.

Figure 9:
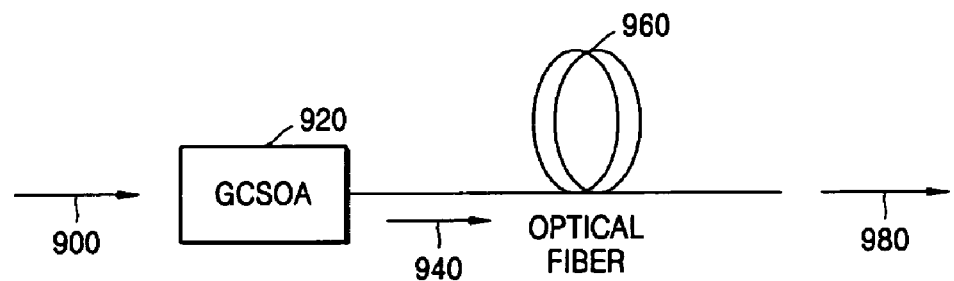
FIG. 9 is a block diagram of an HOA using a GCSOA enabling forward Raman amplification according to another embodiment of the present invention.

FIG. 9 is a block diagram of an HOA using a GCSOA 920 enabling forward Raman amplification according to another embodiment of the present invention.

Referring to FIG. 9, input optical signal 900 to be amplified is input to the GCSOA 920. The optical signal through the GCSOA 920 is amplified in the GCSOA 920 and a spool of optical fiber 960 connected to the GCSOA 920. At this time, control laser 940 for gain clamping from the GCSOA 920 is output in the signal propagation direction into the optical fiber 960. When the laser signal 940 is input to the optical fiber 960, forward Raman pumping is performed in the optical fiber 960. Therefore, the overall output signal 980 is amplified first by the GCSOA 920 and then by the ROA comprising the optical fiber 960 and the laser signal 940. Here, when there is no Raman pumping in the optical fiber 960, the optical fiber 960 acts only as a loss element.

In FIG. 6, the signal and the pumping laser propagate oppositely each other, but in FIG. 9 they propagate to the same direction. To increase the Raman gain in the optical fiber, the optical power of the gain-clamping laser is to be maximized. Therefore, the GCSOA 640 (FIG. 6) should have high laser power to the input direction whereas the GCSOA 920 (FIG. 9) to the output direction. The HOA of FIG. 6 has a merit of lower effective noise figure than that of FIG. 9 since the former can keep the input level high with the help of the backward Raman pumping. On the other hand, the HOA of FIG. 9 can effectively block the back reflection from the HOA to the fiber with insertion of an isolator between the optical fiber (900) and the GCSOA (920).

Figure 10:
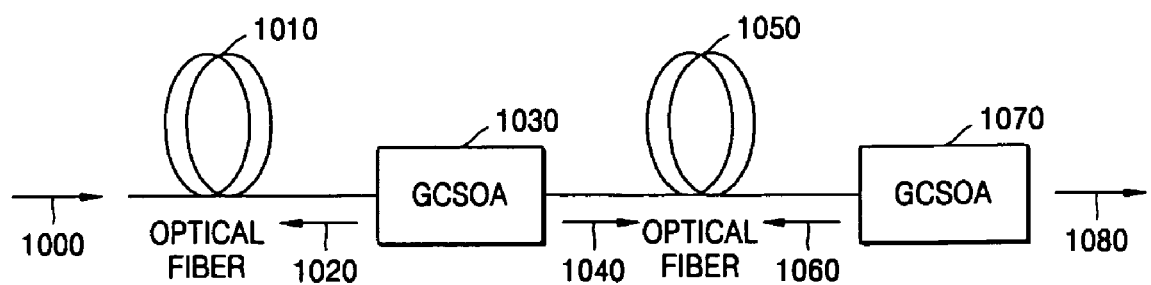
FIG. 10 is a block diagram of an HOA using two-stage GCSOAs enabling Raman amplification according to another embodiment of the present invention.

FIG. 10 is a block diagram of an HOA using two GCSOAs enabling Raman amplification according to another embodiment of the present invention.

Referring to FIG. 10, the structure of the HOA using the GCSOA 640 enabling backward Raman optical amplification shown in FIG. 6 is placed in the first stage. That is, the input signal (1000) is amplified by the first optical fiber 1010 and the first GCSOA 1030 and amplified by the second optical fiber 1050 and the second GCSOA 1070. However, unlike the first optical fiber 1010 which is an optical fiber for transmission, the second optical fiber 1050 is preferably a spool of optical fiber for dispersion compensation. Even though the optical fiber for dispersion compensation usually uses a shorter length compared with the optical fiber for transmission, the loss is not low. For example, a length of ~14 km is used for dispersion compensation of 80-km optical fiber for transmission, but its loss is ~8 dB. A backward gain-clamping laser 1060 output from the second GCSOA 1070 compensates the fiber loss by the Raman amplification. Therefore, the HOA using the two GCSOAs (1030 and 1070) shown in FIG. 10 can be preferably adopted in some node where the optical fiber for dispersion compensation is to be inserted.

In the HOAs described in FIGS. 6, 9, and 10 as embodiments, the gain spectra of the ROAs are controlled using wavelengths of the gain-clamping lasers of the GCSOAs, since the gain of the ROA is determined by the wavelength of the Raman pump as described in FIG. 5. Therefore, the wavelength of the control laser should be selected to assure the appropriate total gain spectrum of the HOA. Another point in the GCSOA is the output power of the control laser. The higher becomes the output power, the more effective the HOA. Accordingly, it is recommended to use the high power affordable. Moreover, since the power of the control laser self-adjusts according to the input signal power, the Raman gain is also adjusted accordingly.

As described above, according to the embodiments of the present invention, the HOA comprising the ROA and the GCSOA is proposed. Since it does not need an extra Raman pump, the whole structure becomes much simpler than the previous invention using the single package of a pump chip, a WSC and a GCSOA chip. The simpler structure enables low cost and high reliability While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A hybrid optical amplifier using a GCSOA enabling Raman amplification, the hybrid optical amplifier comprising:
   a spool of optical fiber used as transmission line in the optical communication;
   a GCSOA amplifying optical signal input via the optical fiber and generating a self-oscillation laser for gain-clamping through the gain medium; and
   a backward pumping ROA inducing Raman amplification by emitting the self-oscillation laser beam generated by the GCSOA into the optical fiber, and wherein the GCSOA comprises:
   a substrate layer made of an InP substrate;
   a lower cladding layer in which DBRs for selecting a wavelength of the self-oscillation laser beam are engraved, formed directly on the substrate layer;
   an active layer which is formed directly on the lower cladding layer, amplifying the optical signal input via the optical fiber;
   an upper cladding layer formed directly on the active layer;
   a metal layer, which is formed directly on the upper cladding layer, forming electrodes to supply driving-current to the GCSOA;
   a second optical fiber inputting optical signal output from the first said GCSOA and compensating dispersion; and
   a second GCSOA amplifying optical signal input via the second optical fiber and generating a second self-oscillation laser beam for gain-clamping through the gain medium.

2. The hybrid optical amplifier of claim 1, wherein the self-oscillation laser beam is generated by a laser resonator formed by engraving Bragg gratings, which reflect narrow-band components of ASE, in an optical waveguide made of semiconductor which is the gain medium.

3. The hybrid optical amplifier of claim 1, wherein the gain of the GCSOA is clamped by intensity of the self-oscillation laser beam increasing when intensity of optical signal input to the GCSOA decreases and decreasing when the intensity of the optical signal input to the GCSOA increases.

4. The hybrid optical amplifier of claim 1, wherein, when effective refractive indices of the lower and upper cladding layers are lower than that of the active layer.

5. The hybrid optical amplifier of claim 1, wherein the DBRs are engraved in an input end and an output end of the GCSOA.

6. The hybrid optical amplifier of claim 1, wherein the DBRs are engraved in an input end and an output end of the GCSOA and the DBRs in the input end and the DBRs in the output end are formed symmetrically to each other.

7. The hybrid optical amplifier of claim 1, wherein the DBRs are engraved in an input end and an output end of the GCSOA and reflecting factors of the input and output ends are controlled by forming the DBRs in the input end and the DBRs in the output end asymmetrically to each other.

8. A hybrid optical amplifier of claim 1, wherein the lower cladding layer in which the DBRs are engraved, is formed essentially over the complete upper surface of the substrate layer; the active layer, which is formed directly on the lower cladding layer, is formed to essentially cover the lower cladding layer; and the upper cladding layer formed directly on the active layer is such as to essentially cover the active layer.

* * * * *